(12) United States Patent
Kim et al.

(10) Patent No.: US 11,569,468 B2
(45) Date of Patent: *Jan. 31, 2023

(54) QUANTUM DOT DEVICE AND QUANTUM DOTS

(71) Applicant: SAMSUNG ELECTRONICS CO., LTD., Suwon-si (KR)

(72) Inventors: Jin A Kim, Suwon-si (KR); Yuho Won, Seoul (KR); Sung Woo Kim, Hwaseong-si (KR); Tae Hyung Kim, Seoul (KR); Jeong Hee Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 41 days.

This patent is subject to a terminal disclaimer.

(21) Appl. No.: 17/193,283

(22) Filed: Mar. 5, 2021

(65) Prior Publication Data

US 2021/0202869 A1 Jul. 1, 2021

Related U.S. Application Data

(63) Continuation of application No. 16/549,430, filed on Aug. 23, 2019, now Pat. No. 10,978,657.

(30) Foreign Application Priority Data

Aug. 23, 2018 (KR) .......................... 10-2018-0098842

(51) Int. Cl.
 *H01L 51/50* (2006.01)
(52) U.S. Cl.
 CPC .................................. *H01L 51/502* (2013.01)

(58) Field of Classification Search
 CPC ... C09K 11/883; C09K 11/885; C09K 11/025; H01L 51/502; B82Y 20/00
 See application file for complete search history.

(56) References Cited

U.S. PATENT DOCUMENTS 6,645,645 B1 11/2003 Adachi et al.
7,700,200 B2 4/2010 Bulovic et al.
(Continued)

FOREIGN PATENT DOCUMENTS

CN 102086396 A 6/2011
EP 2621599 A1 8/2013
(Continued)

OTHER PUBLICATIONS

Aqiang Wang et al., "Bright, Efficient, and Color-stable Violet ZnSe-Based Quantum Dots Light-Emitting Diodes," Nanoscale, Jan. 5, 2015, pp. 1-21, DOI: 10.1039/C4NR06593J.
(Continued)

*Primary Examiner* — Changhyun Yi
(74) *Attorney, Agent, or Firm* — Cantor Colburn LLP

(57) ABSTRACT

Quantum dots and electroluminescent devices including the same, wherein the quantum dots include a core including a first semiconductor nanocrystal including a zinc chalcogenide; and a shell disposed on the core, the shell including zinc, sulfur, and selenium, wherein the quantum dots have an average particle size of greater than 10 nm, wherein the quantum dots do not include cadmium, and wherein a photoluminescent peak of the quantum dots is present in a wavelength range of greater than or equal to about 430 nm and less than or equal to about 470 nm.

21 Claims, 8 Drawing Sheets

(56) References Cited

U.S. PATENT DOCUMENTS

| | | |
|---|---|---|
| 8,120,010 B2 | 2/2012 | Cho et al. |
| 8,637,082 B2 | 1/2014 | Tulsky et al. |
| 9,570,549 B2 | 2/2017 | Jang et al. |
| 9,698,311 B2 | 7/2017 | Greco et al. |
| 10,074,770 B2 | 9/2018 | Park et al. |
| 10,978,657 B2 * | 4/2021 | Kim .................... C09K 11/885 |
| 2005/0274944 A1 | 12/2005 | Jang et al. |
| 2008/0290797 A1 | 11/2008 | Park et al. |
| 2009/0039764 A1 | 2/2009 | Cho et al. |
| 2010/0044635 A1 | 2/2010 | Breen et al. |
| 2012/0032138 A1 | 2/2012 | Kim et al. |
| 2013/0277669 A1 | 10/2013 | Krebs et al. |
| 2014/0014896 A1 | 1/2014 | Chung et al. |
| 2014/0117292 A1 | 5/2014 | Jun et al. |
| 2014/0197400 A1 | 7/2014 | Li et al. |
| 2016/0087047 A1 | 3/2016 | Jeong et al. |
| 2017/0152436 A1 | 6/2017 | Jang et al. |
| 2018/0033856 A1 | 2/2018 | Kwon et al. |
| 2018/0074254 A1 | 3/2018 | Jang et al. |
| 2019/0002759 A1 | 1/2019 | D'Amico et al. |
| 2019/0006556 A1 | 1/2019 | Park et al. |
| 2019/0211265 A1 | 7/2019 | Park et al. |
| 2019/0390109 A1 * | 12/2019 | Ippen .................... C09K 11/025 |
| 2020/0217974 A1 | 7/2020 | Park et al. |

FOREIGN PATENT DOCUMENTS

| | | |
|---|---|---|
| EP | 2820108 A1 | 1/2015 |
| EP | 3536762 A1 | 9/2019 |
| KR | 20110004775 A | 1/2011 |
| KR | 20140121217 A | 10/2014 |
| KR | 20140121351 A | 10/2014 |
| KR | 20150032655 A | 3/2015 |
| KR | 20150121355 A | 10/2015 |
| KR | 20170074585 A | 6/2017 |
| KR | 20180013801 A | 2/2018 |
| WO | 2012035535 A1 | 3/2012 |
| WO | 2012041847 A1 | 4/2012 |
| WO | 2015036762 A1 | 3/2015 |

OTHER PUBLICATIONS

Cheong-Soo Hwang et al., "Characterization of the ZnSe/ZnS Core Shell Quantum Dots Synthesized at Various Temperature Conditions and the Water Soluble ZnSe/ZnS Quantum Dot," Bulletin—Korean Chemical Society, 2005, pp. 1776-1782, vol. 26, No. 11.

Chin-Hau Chia et al., "Radiative recombination of indirect exciton in type-II ZnSeTe/ZnSe multiple quantum wells," Journal of Luminescence, Jan. 7, 2011, pp. 956-959, vol. 131.

Extended European Search Report dated Dec. 6, 2019, of the corresponding European Patent Application No. 19193277.1.

Irshad Ahmad Mir et al., "Cadmium-free aqueous synthesis of ZnSe and ZnSe@ZnS core—shell quantum dots and their differential bioanalyte sensing potential," Materials Research Express, Oct. 10, 2016, pp. 1-9, vol. 3.

Pian Wu et al., "Optimization of Synthesis and Modification of ZnSe/ZnS Quantum Dots for Fluorescence Detection of *Escherichia coil*," Journal of Nanoscience and Nanotechnology, 2018, pp. 3654-3659, vol. 18.

\* cited by examiner

QUANTUM DOT DEVICE AND QUANTUM DOTS

CROSS-REFERENCE TO RELATED APPLICATION

This application is a continuation application of application Ser. No. 16/549,430, filed Aug. 23, 2019, which claims priority to and the benefit of Korean Patent Application No. 10-2018-0098842 filed in the Korean Intellectual Property Office on Aug. 23, 2018, and all the benefits accruing therefrom under 35 U.S.C. § 119, the content of which in its entirety is herein incorporated by reference.

BACKGROUND

1. Field

A quantum dot device and quantum dots are disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, semiconductor nanocrystals also known as quantum dots may be supplied with photoenergy or electrical energy and may emit light in a wavelength corresponding to sizes of the quantum dots. Accordingly, the quantum dots may be used as a light emitting element emitting light of a particular wavelength.

SUMMARY

An embodiment provides a cadmium-free quantum dot-based electroluminescent device.

An embodiment provides the aforementioned quantum dots.

According to an embodiment, an electroluminescent light emitting device includes a first electrode and a second electrode facing each other, and an emission layer disposed between the first electrode and the second electrode, the emission layer including quantum dots, wherein the quantum dots include a core including a first semiconductor nanocrystal including a zinc chalcogenide, and a shell disposed on the core, the shell including zinc, sulfur, and selenium, wherein the quantum dots have an average particle size of greater than 10 nanometers (nm), wherein the quantum dots do not include cadmium, and a photoluminescent peak of the quantum dots is present in a wavelength range of greater than or equal to about 430 nm and less than or equal to about 470 nm.

The quantum dots may have an average particle size of greater than or equal to about 11 nm.

The quantum dots may have an average particle size of greater than or equal to about 12 nm.

The quantum dots may have an average particle size of greater than about 12 nm.

A photoluminescent peak wavelength of the quantum dots may be greater than or equal to about 440 nm.

A photoluminescent peak wavelength of the quantum dots may be greater than or equal to about 450 nm.

The zinc chalcogenide may include zinc, selenium, and optionally tellurium.

The zinc chalcogenide may not include manganese, copper, or a combination thereof.

The zinc chalcogenide may include zinc, selenium, and tellurium and the quantum dots may have a mole ratio of tellurium with respect to selenium of greater than or equal to about 0.001:1.

The zinc chalcogenide may include zinc, selenium, and tellurium and the quantum dots may have a mole ratio of tellurium with respect to selenium of less than or equal to about 0.05:1.

The core may include $ZnSe_{1-x}Te_x$, wherein, x is greater than or equal to about 0 and less than or equal to about 0.05.

The semiconductor nanocrystal shell has a gradient composition varying in a radial direction from the core.

In the semiconductor nanocrystal shell, an amount (or a concentration) of the sulfur may increase toward a surface of the quantum dots.

The semiconductor nanocrystal shell may have a first layer directly disposed on the core and at least one outer layer disposed on the first layer, wherein the first layer may include a second semiconductor nanocrystal having a different composition from a composition of the first semiconductor nanocrystal and the outer layer may include a third semiconductor nanocrystal having a different composition from a composition of the second semiconductor nanocrystal.

The second semiconductor nanocrystal may include zinc, selenium, and optionally tellurium, and the outer layer (or the third semiconductor nanocrystal) may include zinc and sulfur.

The outer layer may be an outermost layer of the quantum dot.

The first semiconductor nanocrystal may include $ZnSe_{1-x}Te_x$, wherein, x is greater than 0 and less than or equal to about 0.05, the second semiconductor nanocrystal may include a zinc selenide, and the third semiconductor nanocrystal may include a zinc sulfide, and may not include selenium.

An energy bandgap of the first semiconductor nanocrystal may be less than an energy bandgap of the second semiconductor nanocrystal and the energy bandgap of the second semiconductor nanocrystal may be less than an energy bandgap of the third semiconductor nanocrystal.

An energy bandgap of the second semiconductor nanocrystal may be less than an energy bandgap of the first semiconductor nanocrystal and an energy bandgap of the third semiconductor nanocrystal.

The quantum dots may have an average particle size of greater than or equal to about 15 nm.

The quantum dots may have an average value of solidity of greater than or equal to about 0.85.

The quantum dots may have an average value of solidity of greater than or equal to about 0.9.

The quantum dots may have a tetrahedron shape, a hexahedron shape (e.g., cubic shape), an octahedron shape, or a combination thereof.

The quantum dots may have less than 4 pods on average.

An average number of the pods included in the quantum dots may be less than or equal to 3.

The quantum dot may include an organic ligand on a surface thereof, and the organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, RHPOOH, or a combination thereof, wherein, each R is the same or different and independently is a C1 to C40 substituted or unsubstituted aliphatic hydrocarbon group, a C6 to C40 substituted or unsubstituted aromatic hydrocarbon group, or a combination thereof.

The electroluminescent device may include a charge auxiliary layer between the first electrode and the quantum dot emission layer, between the second electrode and the quantum dot emission layer, or between the first electrode and the quantum dot emission layer and between the second electrode and the quantum dot emission layer.

The electroluminescent device may have a maximum EQE of greater than or equal to about 3.0%, greater than or equal to about 3.6%, greater than or equal to about 4.7%, greater than or equal to about 5%, greater than or equal to about 5.5%, greater than or equal to about 6%, or greater than or equal to about 6.3%.

The electroluminescent device may have a maximum brightness of greater than or equal to about 1000 $cd/m^2$, greater than or equal to about 1360 $cd/m^2$, greater than or equal to about 1950 $cd/m^2$, greater than or equal to about 2400 $cd/m^2$, greater than or equal to about 2500 $cd/m^2$, greater than or equal to about 2600 $cd/m^2$, greater than or equal to about 2700 $cd/m^2$, or greater than or equal to about 2780 $cd/m^2$.

In an embodiment, a display device includes the aforementioned electroluminescent device.

In an embodiment, the aforementioned quantum dots are provided.

In an embodiment, a composition including a liquid vehicle such as an organic solvent and the aforementioned quantum dots is provided.

In an embodiment, quantum dots include a core; and a shell disposed on the core, wherein a thickness of the shell may be greater than or equal to about 6 nanometers and less than or equal to about 50 nm, wherein the quantum dots have an average particle size of greater than 10 nanometers, and wherein the quantum dots have an average value of solidity of greater than or equal to about 0.85:1.

The quantum dots of an embodiment may be environmentally friendly as the quantum dots do not include a toxic heavy metal such as lead, cadmium, mercury, or the like. The cadmium free quantum dots may be applied to, e.g., used in, various display devices and biolabeling (e.g., a biosensor or bioimaging), a photodetector, a solar cell, a hybrid composite, and the like. The electroluminescent device of the embodiment including the aforementioned cadmium free quantum dots may show enhanced electroluminescent properties.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
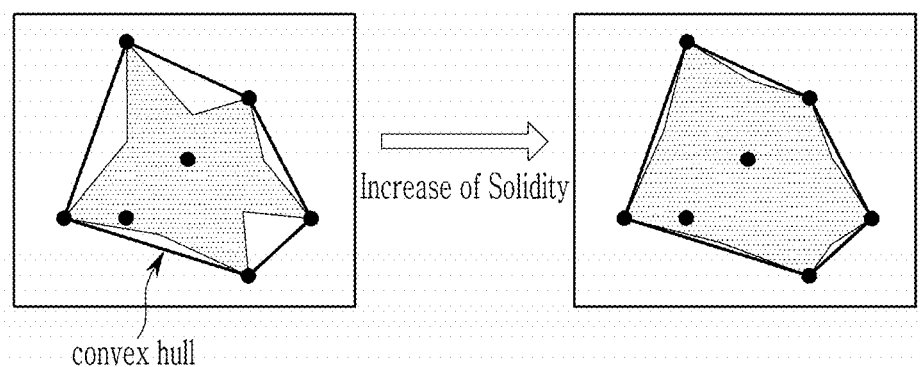
FIG. 1 is a view illustrating the concept of solidity of a particle.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, a work function or an energy level (e.g., a highest occupied molecular orbital (HOMO) energy level or a lowest unoccupied molecular orbital (LUMO) energy level) is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, the term "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkyl ester group, a C3 to C30 alkenyl ester group (e.g., an acrylate group, methacrylate group), a C6 to C30 aryl group, a C7 to C30 alkylaryl group, a C1 to C30 alkoxy group, a C1 to C30 heteroalkyl group, a C3 to C40 heteroaryl group, a C3 to C30 heteroarylalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hydrocarbon group" refers to a group including carbon and hydrogen (e.g., alkyl, alkenyl, alkynyl, aryl, or the like). The hydrocarbon group may be a group having a valence of at least one formed by a removal of at least one hydrogen from an alkane, an alkene, an alkyne, an arene, or the like. At least one methylene in the hydrocarbon group may be replaced with an oxide moiety, a carbonyl moiety, an ester moiety, —NH—, or a combination thereof.

As used herein, when a definition is not otherwise provided, "aliphatic" refers to a C1 to C40 linear or branched hydrocarbon (e.g., alkyl, alkenyl, or alkynyl) group.

As used herein, when a definition is not otherwise provided, "alkoxy" refers to an alkyl group that is linked via an oxygen (i.e., alkyl-O—), for example, methoxy, ethoxy, and sec-butyloxy groups.

As used herein, when a definition is not otherwise provided, "alkyl" refers to a straight or branched chain, saturated, monovalent (e.g., C1 to C40) hydrocarbon group (e.g., methyl or hexyl).

As used herein, when a definition is not otherwise provided, "alkylene" refers to a straight or branched saturated (e.g., C2 to C40) aliphatic hydrocarbon group having a valence of at least two and optionally substituted with at least one substituent.

As used herein, when a definition is not otherwise provided, "alkynyl" refers to a straight or branched chain, monovalent (e.g., C2 to C40) hydrocarbon group having at least one carbon-carbon triple bond (e.g., ethynyl).

As used herein, when a definition is not otherwise provided, an "amine" group has the general formula —NRR, wherein each R is independently hydrogen, a C1-C12 alkyl group, a C7-C20 alkylaryl group, a C7-C20 arylalkyl group, or a C6-C18 aryl group.

As used herein, when a definition is not otherwise provided, "arene" refers to a hydrocarbon having an aromatic ring, and includes monocyclic and polycyclic hydrocarbons wherein the additional ring(s) of the polycyclic hydrocarbon may be aromatic or nonaromatic. Specific examples of arenes include benzene, naphthalene, toluene, and xylene.

As used herein, when a definition is not otherwise provided, "aromatic" refers to an organic compound or group comprising at least one unsaturated cyclic group having delocalized pi electrons. The term encompasses both hydrocarbon aromatic compounds and heteroaromatic compounds.

As used herein, when a definition is not otherwise provided, "aryl" refers to a hydrocarbon group having a valence of at least one, for example, formed by the removal of at least one hydrogen atom from one or more rings of an arene (e.g., phenyl or naphthyl).

As used herein, when a definition is not otherwise provided, "arylalkyl" refers to a substituted or unsubstituted aryl group covalently linked to an alkyl group that is linked to a compound (e.g., a benzyl is a C7 arylalkyl group).

As used herein, when a definition is not otherwise provided, "arylene" refers to a functional group having a valence of at least two obtained by removal of at least two hydrogens in at least one aromatic ring, and optionally substituted with at least one substituent.

As used herein, when a definition is not otherwise provided, the term "hetero" refers to inclusion of at least one (e.g., one to three) heteroatoms, where the heteroatom(s) may be N, O, S, Si, or P, preferably N, O, or S.

As used herein, when a definition is not otherwise provided, "heteroalkyl" refers to an alkyl group that comprises at least one heteroatom covalently bonded to one or more carbon atoms of the alkyl group.

As used herein, when a definition is not otherwise provided, "heteroaryl" refers to an aromatic group that comprises at least one heteroatom covalently bonded to one or more carbon atoms of aromatic ring.

The wording "average" used in this specification (e.g., an average particle size, an average size of the quantum dot, an average value of solidity, an average number of the pods) may be mean or median. In an embodiment, the average may be "mean" average.

Hereinafter, a light emitting device according to an embodiment is described with reference to drawings.

Figure 2:
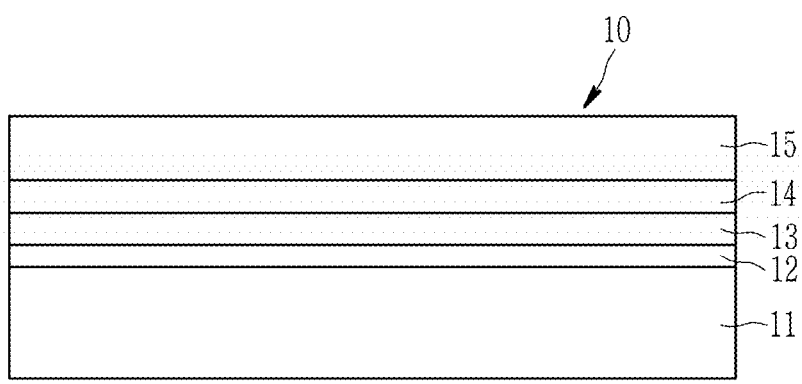
FIG. 2 is a schematic cross-sectional view of a quantum dot light emitting diode (QD LED) device according to an embodiment.

FIG. 2 is a schematic cross-sectional view of an electroluminescent device (hereinafter, also referred to as a light emitting device) according to an embodiment.

Referring to FIG. 2, a light emitting device 10 according to an embodiment includes a first electrode 11 and a second electrode 15 facing each other, and an emission layer 13 disposed between the first electrode 11 and the second electrode 15 and including quantum dots. A hole auxiliary layer 12 may be disposed between the first electrode 11 and the emission layer 13, and an electron auxiliary layer 14 may be disposed between the second electrode 15 and the emission layer 13.

The device may further include a substrate. The substrate may be disposed on a major (e.g., lower) surface of the first electrode 11 or on a major (e.g., upper) surface of the second electrode 15. In an embodiment, the substrate may be disposed on a major (e.g., lower) surface of the first electrode. The substrate may be a substrate including an insulation material (e.g., insulating transparent substrate). The substrate may include glass; a polymer such as a polyester (e.g., polyethylene terephthalate (PET), polyethylene naphthalate (PEN)), a polycarbonate, a polyacrylate, a polyimide, a polyamideimide, or a combination thereof; a polysiloxane (e.g., PDMS); an inorganic material such as $Al_2O_3$, ZnO, or a combination thereof; or a combination thereof, but is not limited thereto. The substrate may be made of a silicon wafer. Herein "transparent" may refer to transmittance for light of a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or fluorine doped tin oxide; or a combination of a metal and a metal oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode.

The second electrode 15 may be made of a conductor, for example, a metal, a conductive metal oxide, a conductive polymer, or a combination thereof. The second electrode 15 may include, for example, a metal or an alloy thereof such as aluminum, magnesium, calcium, sodium, potassium, titanium, indium, yttrium, lithium, gadolinium, silver, tin, lead, cesium, or barium; a multi-layer structured material such as LiF/Al, $Li_2O$/Al, Liq/Al, LiF/Ca, or $BaF_2$/Ca, but is not limited thereto. The conductive metal oxide is the same as described above.

In an embodiment, a work function of the first electrode 11 may be from about 4.5 electronvolts (eV) to about 5.0 eV (e.g., from about 4.6 eV to about 4.9 eV). The work function of the second electrode 15 may be greater than or equal to about 4.0 eV and less than about 4.5 eV (e.g., from about 4.0 eV to about 4.3 eV). In an embodiment, a work function of the second electrode 15 may be from about 4.5 eV to about 5.0 eV (e.g., from about 4.6 eV to about 4.9 eV). The work function of the first electrode 11 may be greater than or equal to about 4.0 eV and less than about 4.5 eV (e.g., from about 4.0 eV to about 4.3 eV). A work function of the first electrode may be lower than a work function of the second electrode. A work function of the first electrode may be higher than a work function of the second electrode.

The first electrode 11, the second electrode 15, or a combination thereof may be a light-transmitting electrode and the light-transmitting electrode may be, for example, made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of, for example, an opaque conductor such as aluminum (Al), silver (Ag), or gold (Au).

A thickness of the electrodes (the first electrode, the second electrode, or a combination thereof) is not particularly limited and may be appropriately selected taking into consideration device efficiency. For example, the thickness of the electrodes may be greater than or equal to about 5 nm, for example, greater than or equal to about 50 nm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The emission layer 13 includes (e.g., a plurality of) quantum dots. The quantum dots (hereinafter, also referred to as semiconductor nanocrystals) may absorb light from an excitation source to be excited and may emit energy corresponding to an energy bandgap of the quantum dot. The energy bandgap of the quantum dot may vary with a size and a composition of the semiconductor nanocrystal. For example, as the size of a quantum dot increases, the quantum dot may have a narrower energy bandgap, thereby having an increased luminous wavelength. Semiconductor nanocrystals may be used as a light emitting material in various fields such as a display device, an energy device, or a bio light emitting device.

Quantum dots having a photoluminescence (PL) property at an applicable level may include cadmium (Cd). Cadmium may cause environment/health problems and is one of the restricted elements via Restriction of Hazardous Substances Directive (RoHS) in many countries. Accordingly, development of a cadmium-free semiconductor nanocrystal particle having improved photoluminescence characteristics is desired. However, developing cadmium free quantum dots emitting blue light and exhibiting desired electroluminescent properties (e.g., a narrower full width at half maximum (FWHM), enhanced EQE, increased brightness, or the like) and an electroluminescent device including the same may be difficult. In an embodiment, in order to realize a QD-LED device having increased brightness and enhanced color gamut, a blue light emitting quantum dot having a PL peak of about 450 nm to about 460 nm, an increased PL quantum yield (QY), and a narrow FWHM may be provided. To date, no report known to the inventors has been made for cadmium free quantum dot that allows the aforementioned electroluminescent properties in a device. Luminous properties of a ZnSe/ZnS core/shell structure may be difficult to control at a wavelength of greater than or equal to about 440 nm. An increase of particle size beyond a predetermined level may cause an adverse effect on the efficiency of the quantum dot. The present inventors have been found that a thick shell may be advantageous for securing stability and efficiency required for the application to a device. However, the increase of the shell thickness may also result in an irregular morphology of the quantum dot and may tend to result in a decrease of a photoluminescent efficiency.

In an embodiment, a blue light emitting quantum dot may be prepared by controlling a shell growth condition (e.g., a reaction temperature, an injection rate of precursor(s), or other factors affecting a shell growth rate and types and amounts of precursor(s)) to have a composition that will be described below, and whereby the quantum dots of the embodiment may have both of an increased particle size and a desired morphology (for example, a solidity that will be described later). The quantum dots of the embodiments may exhibit relatively enhanced external quantum efficiency (EQE) and increased brightness. Thus, an embodiment is related to the quantum dots (e.g., a population of the quantum dots).

In an embodiment, the quantum dots (e.g., included in the light emitting layer of the electroluminescent device) may include a core including a first semiconductor nanocrystal including a zinc chalcogenide; and a shell disposed on the core and including zinc, sulfur, and selenium. The quantum dots have an average particle size of greater than 10 nm, for example, greater than or equal to about 11 nm, greater than or equal to about 12 nm, or greater than about 12 nm. The quantum dot does not include cadmium. The quantum dots are configured to emit blue light. An average value of solidity (hereinafter, also referred to as solidity) of the quantum dots may be greater than or equal to about 0.85, for example, greater than or equal to about 0.88, greater than or equal to about 0.9, greater than or equal to about 0.91, or greater than or equal to about 0.92.

As used herein, the term "solidity" refers to a ratio of an area (B) of a two dimensional area of a quantum dot with respect to an area (A) of a convex hull. The convex hull may be defined as the smallest convex set of points in which a set of all points constituting a two dimensional image of a given quantum dot obtained by an electron microscopic analysis is contained. Stated otherwise, the convex hull may be defined as a convex polygon of the smallest area in which a set of all points constituting a two dimensional image of a given quantum dot obtained by an electron microscopic analysis is contained. (see FIG. 1) The solidity may be measured by a transmission electron microscopic analysis. For example, a commercially-available computer program (e.g., an image processing program such as "image J") may be used to calculate (an average value of) solidity from a transmission electron microscopy (TEM) image of the quantum dots.

The electroluminescent device of an embodiment includes the aforementioned quantum dots and thereby may exhibit a desired level of electroluminescent properties, even when they are based on a cadmium free quantum dot.

The first semiconductor nanocrystal included in the core of the quantum dots may include a zinc chalcogenide including zinc, selenium, and optionally tellurium. The zinc chalcogenide may not include manganese, copper, or a combination thereof. The first semiconductor nanocrystal may include a limited amount of tellurium. The core may include $ZnSe_{1-x}Te_x$ (wherein, x is greater than or equal to about 0 and less than or equal to about 0.05).

A size (e.g., a diameter) of the core may be greater than or equal to about 1.5 nm, greater than or equal to about 2 nm, greater than or equal to about 2.1 nm, greater than or equal to about 2.2 nm, greater than or equal to about 2.3 nm, greater than or equal to about 2.4 nm, or greater than or equal to about 2.5 nm. A size of the core may be less than or equal to about 5 nm, less than or equal to about 4.9 nm, less than or equal to about 4.8 nm, less than or equal to about 4.7 nm, less than or equal to about 4.6 nm, less than or equal to about 4.5 nm, less than or equal to about 4.4 nm, less than or equal to about 4.3 nm, less than or equal to about 4.2 nm, less than or equal to about 4.1 nm, less than or equal to about 4 nm, less than or equal to about 3.9 nm, less than or equal to about 3.8 nm, less than or equal to about 3.7 nm, less than or equal to about 3.6 nm, or less than or equal to about 3.5 nm. In an embodiment, a size may refer to an average size. The average may be "mean" average.

The quantum dots may have less than 4 pods on average.

An average number of the pods included in the quantum dots may be less than or equal to 3.

The semiconductor nanocrystal shell has a gradient composition varying in a radial direction from the core. In the semiconductor nanocrystal shell, an amount (e.g., a concentration) of the sulfur may increase toward a surface of the quantum dots.

The semiconductor nanocrystal shell may include at least two layers and adjacent layers may have a different composition. In an embodiment, the semiconductor nanocrystal shell may include a first layer disposed directly on the core and at least one outer layer (e.g., a second layer, a third layer, etc.) disposed on the first layer. The first layer may include a second semiconductor nanocrystal and the outer layer (e.g., the second layer or the third layer) may include a third semiconductor nanocrystal having a different composition from the second semiconductor nanocrystal.

The second semiconductor nanocrystal may include zinc, selenium, and optionally tellurium. In an embodiment, the second semiconductor nanocrystal may include ZnSe, ZnSeS, or a combination thereof. The outer layer (or the third semiconductor nanocrystal) may include zinc and sulfur, and optionally a selenium. In an embodiment, the outer layer (or the third semiconductor nanocrystal) may include ZnSeS, ZnS, or a combination thereof.

An outermost layer of the quantum dot may include a semiconductor nanocrystal consisting of zinc and sulfur.

In the quantum dots included in the electroluminescent device of the embodiment, the first semiconductor nanocrystal may include $ZnSe_{1-x}Te_x$ (wherein, x is greater than 0 and less than or equal to about 0.05), the second semiconductor nanocrystal may include a ZnSe, and the third semiconductor nanocrystal may include a ZnS and may not include selenium.

In an embodiment, an energy bandgap of the first semiconductor nanocrystal may be less than that of the second semiconductor nanocrystal and an energy bandgap of the second semiconductor nanocrystal may be less than that of the third semiconductor nanocrystal (Type 1). In an embodiment, an energy bandgap of the second semiconductor nanocrystal may be less than those of the first semiconductor nanocrystal and the third semiconductor nanocrystal (Reverse Type 1).

A thickness of a shell may be selected taking into consideration a composition and a size of the core. In an embodiment, the thickness of the shell may be greater than or equal to about 4 nm, greater than or equal to about 5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, greater than or equal to about 10.5 nm, greater than or equal to about 11 nm, greater than or equal to about 12 nm, or greater than or equal to about 13 nm. The thickness of the shell may be less than or equal to about 50 nm, less than or equal to about 40 nm, less than or equal to about 30 nm, less than or equal to about 20 nm, less than or equal to about 19 nm, less than or equal to about 18 nm, or less than or equal to about 17 nm. A thickness of the shell may be in a range of 4 nm to 10 nm In the quantum dots, if present, a molar amount of tellurium with respect to one mole of selenium may be greater than or equal to about 0.0001 moles, greater than or equal to about 0.0005 moles, greater than or equal to about 0.0006 moles, greater than or equal to about 0.0007 moles, greater than or equal to about 0.0008 moles, greater than or equal to about 0.0009 moles, greater than or equal to about 0.001 moles, greater than or equal to about 0.002 moles, greater than or equal to about 0.003 moles, greater than or equal to about 0.004 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.02 moles, or greater than or equal to about 0.025 moles. In the core or the quantum dot, an amount of the tellurium with respect to one mole of selenium may be less than or equal to about 0.053 moles, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 moles, less than or equal to about 0.035 moles, less than or equal to about 0.03, less than or equal to about 0.02 moles, less than or equal to about 0.0135 moles, less than or equal to about 0.013 moles, less than or equal to about 0.01 moles, less than or equal to about 0.009 moles, less than or equal to about 0.008 moles, less than or equal to about 0.007 moles, or less than or equal to about 0.006 moles.

In the quantum dots or the cores thereof, an amount of tellurium with respect to one mole of zinc may be greater than or equal to about 0.0001 moles, greater than or equal to about 0.0005 moles, greater than or equal to about 0.0006 moles, greater than or equal to about 0.0007 moles, greater than or equal to about 0.0008 moles, greater than or equal to about 0.0009 moles, greater than or equal to about 0.001 moles, greater than or equal to about 0.002 moles, greater than or equal to about 0.003 moles, greater than or equal to about 0.004 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.02 moles, or greater than or equal to about 0.025 moles.

In the quantum dots or the cores thereof, an amount of tellurium with respect to one mole of zinc may be less than or equal to about 0.053 moles, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 moles, less than or equal to about 0.035 moles, less than or equal to about 0.03 moles, 0.02 moles, less than or equal to about 0.01 moles, less than or equal to about 0.009 moles, less than or equal to about 0.008 moles, less than or equal to about 0.007 moles, less than or equal to about 0.006 moles, less than or equal to about 0.005 moles, less than or equal to about 0.004 moles, or less than or equal to about 0.003 moles.

In the quantum dot according to an embodiment, a molar ratio of the sum of sulfur and selenium with respect to zinc ((Se+S)/Zn) may be greater than or equal to about 0.5:1, greater than or equal to about 0.6:1, greater than or equal to about 0.7:1, greater than or equal to about 0.8:1, or greater than or equal to about 0.85:1. In the quantum dot according to an embodiment, a molar ratio of the sum of sulfur and selenium with respect to zinc ((Se+S)/Zn) may be less than or equal to about 1.1:1, less than or equal to about 1.05:1, less than or equal to about 1.0:1, less than or equal to about 0.99:1, less than or equal to about 0.98:1, less than or equal to about 0.97:1, less than or equal to about 0.96:1, or less than or equal to about 0.95:1.

In the quantum dot according to an embodiment, a molar ratio of sulfur with respect to selenium may be greater than or equal to about 0.4, greater than or equal to about 0.5:1, greater than or equal to about 0.6:1, greater than or equal to about 0.7:1, greater than or equal to about 0.75:1, greater than or equal to about 0.76:1, greater than or equal to about 0.77:1, greater than or equal to about 0.78:1, greater than or equal to about 0.79:1, or greater than or equal to about 0.8:1. In the quantum dot according to an embodiment, a molar ratio of sulfur with respect to selenium may be less than or equal to about 2:1, less than or equal to about 1.9:1, less than or equal to about 1.8:1, less than or equal to about 1.7:1, less than or equal to about 1.6:1, less than or equal to about 1.55, less than or equal to about 1.5, less than or equal to about 1.45, less than or equal to about 1.4, or less than or equal to about 1.37.

The quantum dots included in the device of the embodiment may have a relatively large particle size. In an embodiment, an average size of the quantum dot may be greater than or equal to about 10 nm. In an embodiment, an average size of the aforementioned quantum dots may be greater than 10 nm, greater than or equal to about 10.5 nm, greater than or equal to about 11 nm, greater than or equal to about 11.5 nm, greater than or equal to about 12 nm, greater than or equal to about 12.3 nm, greater than or equal to about 12.4 nm, greater than or equal to about 12.5 nm, greater than or equal to about 12.6 nm, greater than or equal to about 12.7 nm, greater than or equal to about 12.8 nm, greater than or equal to about 12.9 nm, greater than or equal to about 13 nm, greater than or equal to about 13.5 nm, greater than or equal to about 14 nm, greater than or equal to about 14.5 nm, greater than or equal to about 15 nm, greater than or equal to about 15.5 nm, or greater than or equal to about 16 nm. An average size of the aforementioned quantum dots may be less than or equal to about 50 nm, less than or equal to about 45 nm, less than or equal to about 40 nm, less than or equal to about 35 nm, less than or equal to about 30 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, or less than or equal to about 20 nm. In the embodiment, a size of the quantum dot may be a diameter (or an equivalent diameter) calculated from a two dimensional image obtained from an (transmission) electron microscope analysis under an assumption that the image is a round circle.

The quantum dots included in the device of the embodiment have a shape of a relatively increased density even when the quantum dots have relatively large sizes. A convex area of an object may be defined as an area of a convex hull enclosing the object and a convex hull of an object may be defined as the smallest convex shape that contains the object. Thus, the solidity may represent a shape density of a given object and the measurement of the solidity may be obtained as a ratio of the area of the object with respect to the area of the convex hull of the object.

In an embodiment, the solidity of the quantum dots of the embodiment may be greater than or equal to about 0.86, greater than or equal to about 0.87, greater than or equal to about 0.88, greater than or equal to about 0.89, greater than or equal to about 0.90, greater than or equal to about 0.91, or greater than or equal to about 0.92. The quantum dots of the embodiment may have the solidity of the aforementioned ranges together with the aforementioned sizes and the quantum dots may exhibit improved electroluminescent properties.

A photoluminescent peak wavelength of the quantum dots may be greater than or equal to about 430 nm, greater than or equal to about 440 nm, greater than or equal to about 445 nm, or greater than or equal to about 450 nm and less than or equal to about 480 nm, less than or equal to about 475 nm, less than or equal to about 470 nm, or less than or equal to about 465 nm.

The quantum dots of the embodiment may emit blue light that has a maximum peak wavelength of about 450 nm to about 460 nm.

A maximum luminescent peak wavelength of the electroluminescent device of an embodiment (Lamda Max) may be greater than or equal to about 440 nm, greater than or equal to about 445 nm, greater than or equal to about 450 nm, greater than or equal to about 451 nm, or greater than or equal to about 452 nm and less than or equal to about 470 nm, less than or equal to about 465 nm, or less than or equal to about 460 nm.

The maximum emission peak of the quantum dots may have a FWHM of less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, or less than or equal to about 27 nm.

The quantum dots may have a quantum efficiency (hereinafter, also referred to as a quantum yield) of greater than or equal to about 50%, for example, greater than or equal to about 60%, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, greater than or equal to about 69%, greater than or equal to about 70%, greater than or equal to about 71%, greater than or equal to about 72%, greater than or equal to about 73%, greater than or equal to about 74%, greater than or equal to about 75%, greater than or equal to about 76%, greater than or equal to about 77%, greater than or equal to about 78%, greater than or equal to about 79%, or greater than or equal to about 80%.

The quantum dots may have an organic ligand on a surface thereof. The organic ligand may include, RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof, wherein, R and R' independently are a C1 to C40 substituted or unsubstituted aliphatic hydrocarbon group, a C6 to C40 substituted or unsubstituted aromatic hydrocarbon group, or a combination thereof.

In an embodiment, the quantum dots included in the device of the embodiment may be prepared by a method, which includes:

obtaining a core including a first semiconductor nanocrystal including zinc, selenium, and tellurium (hereinafter referred to as a "core");

reacting a zinc precursor in an organic solvent in the presence of the core including the first semiconductor nanocrystal and the organic ligand with a non-metal precursor of a selenium precursor, a sulfur precursor, or a combination thereof, a plurality of times, to form a semiconductor nanocrystal shell including zinc and selenium, and sulfur on a surface of the core at a relatively high temperature (e.g., of greater than or equal to about 300° C., or at least 320° C. such as greater than or equal to about 330° C. or higher).

The temperature for a shell formation may be less than or equal to about 360° C., or less than or equal to about 350° C.

The non-metal precursors may be intermittently injected in a split manner (e.g., at a predetermined amount divided from a desired total amount) at least two times taking into consideration a desired thickness and composition of the shell.

The formation of the semiconductor nanocrystal shell may include reacting the zinc precursor with the selenium precursor and optionally a sulfur precursor and then reacting the zinc precursor with the sulfur precursor.

In an embodiment, the core may be obtained by preparing a zinc precursor solution including a zinc precursor and an organic ligand; preparing a selenium precursor and a tellurium precursor; and heating the zinc precursor solution up to a first reaction temperature and adding the selenium precursor and the tellurium precursor and an organic ligand and performing a reaction.

The zinc precursor may be a Zn metal powder, ZnO, an alkylated Zn compound (e.g., C2 to C30 dialkyl zinc such as diethyl zinc), a Zn alkoxide (e.g., zinc ethoxide), a Zn carboxylate (e.g., zinc acetate), a Zn nitrate, a Zn perchlorate, a Zn sulfate, Zn acetylacetonate, a Zn halide (e.g., zinc chloride), a Zn cyanide, a Zn hydroxide, or a combination thereof. Examples of the zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-tributylphosphine (Te-TBP), tellurium-triphenylphosphine (Te-TPP), tellurium-diphenylphosphine (Te-DPP), or a combination thereof, but is not limited thereto.

The sulfur precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The organic solvent may include a C6 to C22 primary amine such as hexadecylamine, a C6 to C22 secondary amine such as dioctylamine, a C6 to C40 tertiary amine such as trioctylamine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine substituted with at least one (e.g., 1, 2, or 3) C6 to C22 alkyl group (e.g., trioctylphosphine), a phosphine oxide substituted with at least one (e.g., 1, 2, or 3) C6 to C22 alkyl group (e.g., trioctyl phosphine oxide), a C12 to C22 aromatic ether such as phenyl ether or benzyl ether, or a combination thereof.

The organic ligand may coordinate, e.g., bind to, the surface of the produced nanocrystal and may have an effect on light emitting and electric characteristics and may effectively disperse the nanocrystal in an organic solvent. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof, wherein, R and R' independently are a C1 to C24 (C3 to C40) substituted or unsubstituted aliphatic hydrocarbon group, a C6 to C20 (C6-C40) substituted or unsubstituted aromatic hydrocarbon group, or a combination thereof. One or more organic ligands may be used.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, or stearic acid; a phosphine such as methyl phosphine, ethyl phosphine, propyl phosphine, butyl phosphine, pentyl phosphine, tributyl phosphine, or trioctyl phosphine; a phosphine oxide compound such as methyl phosphine oxide, ethyl phosphine oxide, propyl phosphine oxide, butyl phosphine oxide, or trioctyl phosphine oxide; a diphenyl phosphine or triphenyl phosphine compound, or an oxide compound thereof; a C5 to C20 alkyl phosphonic acid such as hexylphosphinic acid, octylphosphinic acid, dodecanephosphinic acid, tetradecanephosphinic acid, hexadecanephosphinic acid, octadecanephosphinic acid; phosphonic acid; and the like, but are not limited thereto. One or more organic ligand compounds may be used. In an embodiment, the organic ligand compound may be a combination of RCOOH and an amine (e.g., $RNH_2$, $R_2NH$, $R_3N$, or a combination thereof) wherein, R is independently a C1 to C24 (C3-C40) substituted or unsubstituted aliphatic hydrocarbon group or a C6 to C20 (C6-C40) substituted or unsubstituted aromatic hydrocarbon group. In an embodiment R is independently a C1 to C24 (C3-C40) substituted or unsubstituted aliphatic hydrocarbon group.

In the core including the first semiconductor nanocrystal, a mole ratio of tellurium with respect to selenium may be less than or equal to about 0.05:1. In order to form the core, an amount of the selenium precursor during formation of the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles, with respect to 1 mole of the tellurium precursor during formation of the core. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles, with respect to 1 mole of the tellurium precursor. Within the amount ranges, the core having the composition described above may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours but is not limited thereto. By controlling the reaction time, the size of the core may be adjusted.

In a method of an embodiment, a reaction condition for a shell growth is controlled and thereby a shell composition and a growth rate thereof are controlled, which makes it possible to provide a quantum dot having an increased particle size and the aforementioned solidity at the same time.

In a method of an embodiment, a solvent and optionally an organic ligand is heated (or vacuum treated) at a predetermined temperature (e.g., greater than or equal to about 100° C.) in a flask, then an atmosphere in the flask is converted into an inert gas atmosphere, and the solvent and optionally the organic ligand are heated again at a predetermined temperature (e.g., greater than or equal to about 100° C.). Subsequently, the core is added, and the shell precursors are added step by step (e.g., in multiple steps) at a predetermined reaction temperature to conduct a reaction. The number of the steps and the injected amounts of the precursors may be determined taking into consideration a reactivity of each of the shell precursors and a desired composition of the shell (e.g., having a gradient concentration or a multi-layered structure). In an embodiment, a selenium precursor (and optionally a sulfur precursor) may be injected in a plurality of the steps (e.g., intermittently) to form a first layer. Then, a predetermined amount of a sulfur precursor is added over a plurality of steps (e.g., intermittently) to form an outer layer. A reaction temperature for a shell formation may be greater than or equal to about 300° C., greater than or equal to about 310° C., greater than or equal to about 320° C., greater than or equal to about 325° C., or greater than or equal to about 330° C. The temperature for a shell formation may be less than or equal to about 360° C., or less than or equal to about 350° C.

After completing the reaction, a nonsolvent is added to reaction products and nanocrystal particles coordinated with, e.g., bound to, the ligand compound may be separated. The nonsolvent may be a polar solvent that is miscible with the solvent used in the core formation reaction, shell formation reaction, or a combination thereof and is not capable of dispersing the produced nanocrystals therein. The nonsolvent may be selected depending the solvent used in the reaction and may be, for example, acetone, ethanol, butanol, isopropanol, ethanediol, water, tetrahydrofuran (THF), dimethyl sulfoxide (DMSO), diethyl ether, formaldehyde, acetaldehyde, ethylene glycol, a solvent having a similar solubility parameter to the foregoing solvents, or a combination thereof. The nanocrystal particles may be separated through centrifugation, sedimentation, chromatography, or distillation. The separated nanocrystals may be added to a washing solvent and washed, if desired. The washing solvent has no particular limit and may have a similar solubility parameter to that of the ligand and may include, for example, hexane, heptane, octane, chloroform, toluene, benzene, and the like.

The quantum dots of the embodiment may not be dispersible in water, any of the foregoing listed non-solvents, or a mixture thereof. The quantum dots of the embodiment may be water-insoluble.

The quantum dots of the embodiments may be dispersed in the aforementioned organic solvent. In some embodiments, the quantum dots may be dispersed in a C6 to C40 aliphatic hydrocarbon, a C6 to C40 aromatic hydrocarbon, or a mixture thereof.

In an embodiment, the emission layer 13 may include a monolayer of quantum dots. In an embodiment, the emission layer 13 may include at least one monolayer of quantum dots, for example, at least 2 monolayers, at least 3 monolayers, or at least 4 monolayers, and less than or equal to about 20 monolayers, less than or equal to about 10 monolayers, less than or equal to about 9 monolayers, less than or equal to about 8 monolayers, less than or equal to about 7 monolayers, or less than or equal to about 6 monolayers. The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emission layer 13 may have, for example, a thickness of about 10 nm to about 150 nm, for example, about 10 nm to about 100 nm, for example, about 10 nm to about 50 nm.

The device of an embodiment may further include a hole auxiliary layer. In a non-limiting embodiment, the hole auxiliary layer 12 is disposed between the first electrode 11 and the emission layer 13. The hole auxiliary layer 12 may have one layer or two or more layers, and may include, for example, a hole injection layer (HIL), a hole transport layer (HTL), an electron blocking layer, or a combination thereof.

The hole auxiliary layer 12 may have a HOMO energy level that may match a HOMO energy level of the emission layer 13 and may enforce, e.g., aid, mobility of holes from the hole auxiliary layer 12 into the emission layer 13.

The HOMO energy level of the hole auxiliary layer 12 (e.g., hole transport layer (HTL)) contacting the emission layer may be the same as or less than the HOMO energy level of the emission layer 13 within a range of less than or equal to about 1.0 eV. For example, a difference of HOMO energy levels between the hole auxiliary layer 12 and the emission layer 13 may be about 0 eV to about 1.0 eV, for example, about 0.01 eV to about 0.9 eV, about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

In an embodiment, the hole auxiliary layer 12 may include a hole injection layer nearer to the first electrode 11 and a hole transport layer nearer to the emission layer 13. Herein, the HOMO energy level of the hole injection layer may be about 5.0 eV to about 5.3 eV and the HOMO energy level of the hole transport layer may be about 5.2 eV to about 5.5 eV.

A material included in the hole auxiliary layer 12 (for example, a hole transporting layer or a hole injection layer) is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

The electron blocking layer (EBL) may include, for example, poly(3,4-ethylenedioxythiophene):poly(styrene sulfonate) (PEDOT:PSS), poly(9,9-dioctyl-fluorene-co-N-

(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected depending on the desired characteristics of each layer. For example, the thickness of each layer may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 is disposed between the emission layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer, the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, HfO$_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

In an embodiment, the electron auxiliary layer 14 may include an electron transport layer. The ETL may include a plurality of nanoparticles.

The nanoparticles include a metal oxide including zinc.

The metal oxide may include zinc oxide, zinc magnesium oxide, or a combination thereof. The metal oxide may include $Zn_{1-x}M_xO$ (wherein M is Mg, Ca, Zr, W, Li, Ti, or a combination thereof and $0 \leq x \leq 0.5$). In an embodiment, the M may be magnesium (Mg). In an embodiment, x may be greater than or equal to about 0.01 and less than or equal to about 0.3, for example, less than or equal to about 0.25, less than or equal to about 0.2, or less than or equal to about 0.15.

An absolute value of LUMO of quantum dots included in the emission layer may be smaller than an absolute value of LUMO of the metal oxide. In an embodiment, an absolute value of LUMO of quantum dots may be larger than an absolute value of LUMO of a metal oxide ETL. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 3:
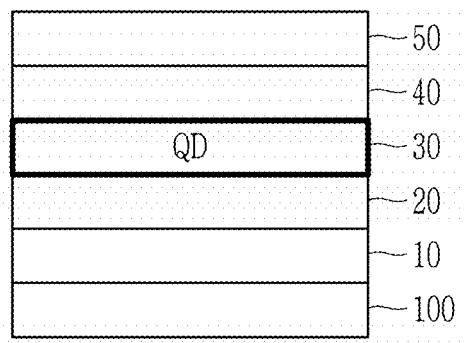
FIG. 3 is a schematic cross-sectional view of a QD LED device according to an embodiment.

In a device according to an embodiment, an anode 10 disposed on a transparent substrate 100 may include a metal oxide-based transparent electrode (e.g., ITO electrode) and a cathode 50 facing the anode may include a metal (Mg, Al, etc.) of a relatively low work function. For example, a hole auxiliary layer 20, for example, a hole transport layer including TFB, poly(9-vinylcarbazole) (PVK), or a combination thereof; a hole injection layer including PEDOT:PSS, a p-type metal oxide, or a combination thereof; or a combination thereof may be disposed between the transparent electrode 10 and the emission layer 30. An electron auxiliary layer 40 such as an electron injection layer/transport layer may be disposed between the quantum dot emission layer 30 and the cathode 50. (see FIG. 3)

Figure 4:
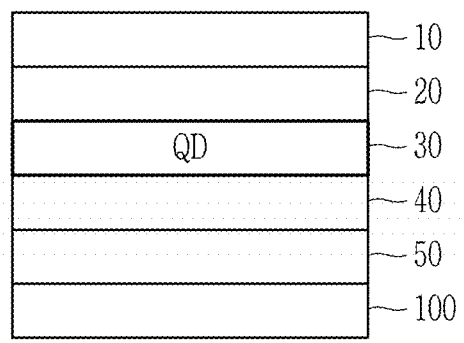
FIG. 4 is a schematic cross-sectional view of a QD LED device according to an embodiment.

A device according to an embodiment has an inverted structure. Herein, the cathode 50 disposed on a transparent substrate 100 may include a metal oxide-based transparent electrode (e.g., ITO) and the anode 10 facing the cathode may include a metal (e.g., Au, Ag, etc.) of a relatively high work function. For example, an n-type metal oxide (ZnO) may be disposed between the transparent electrode 50 and the emission layer 30 as an electron auxiliary layer 40 (e.g., an electron transport layer (ETL)). A hole auxiliary layer 20 (e.g., a hole transport layer (HTL) including TFB, PVK, or a combination thereof a hole injection layer (HIL) including MoO$_3$ or another p-type metal oxide, or a combination thereof) may be disposed between the metal anode 10 and the quantum dot emission layer 30 as a hole auxiliary layer (e.g., hole transport layer (HTL)). (see FIG. 4)

The device of the embodiment may be prepared in an appropriate manner. In an embodiment, the electroluminescent device may be prepared by forming a charge (e.g., hole) auxiliary layer on a substrate having an electrode thereon (e.g., via deposition or coating), forming an emissive layer including the quantum dots (e.g., a pattern of the aforementioned quantum dots) thereon (e.g., via deposition or coating), and forming an electrode (optionally together with a charge (e.g., electron) auxiliary layer) thereon (e.g., via deposition or coating). The formation of the electrode/hole auxiliary layer/electron auxiliary layer is not particularly limited and may be selected appropriately.

Formation of the emissive layer may be carried out by preparing an ink composition including the aforementioned quantum dots of the embodiment and a liquid vehicle, and depositing the prepared ink composition (for example, via an ink jet printing method or the like). Accordingly, an embodiment is related to an ink composition including the aforementioned quantum dots and a liquid vehicle. The ink composition may further include a light diffusing particle, a binder (e.g., a binder having a carboxylic acid group), and optionally at least one additive (e.g., a monomer having a carbon-carbon double bond, a crosslinker, an initiator, or the like). The light diffusing particle may include $TiO_2$, $SiO_2$, $BaTiO_3$, $ZnO$, or a combination thereof. The light diffusing particle may have a size of greater than or equal to about 100 nm and less than or equal to about 1 μm.

The liquid vehicle may include an organic solvent. The liquid vehicle (e.g., the organic solvent) are not particularly limited. Types and amounts of the organic solvent may be appropriately selected by taking into consideration the aforementioned main components (i.e., the quantum dot, the COOH group-containing binder, the photopolymerizable monomer, the photoinitiator, and if used, the thiol compound), and types and amounts of additives which will be described below. Non-limiting examples of the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; a glycol ether acetate such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; a C1 to C40 aliphatic hydrocarbon (e.g., an alkane, alkene, or alkyne); a halogen- (e.g., chloro-) substituted C1 to C40 aliphatic hydrocarbon (e.g., dichloroethane, trichloromethane, or the like); a C6 to C40 aromatic hydrocarbon (e.g., toluene, xylene, or the like); a halogen (e.g., chloro) substituted C6 to C40 aromatic hydrocarbon; or a combination thereof.

Components included in the ink composition and concentrations thereof may be adjusted to control a viscosity of the ink composition, which is not particularly limited. A viscosity of the ink composition may be less than or equal to about 20 centipoise (cP), less than or equal to about 15 cP, less than or equal to about 10 cP, less than or equal to about 5 cP, less than or equal to about 4 cP, less than or equal to about 3 cP, less than or equal to about 2 cP, or less than or equal to about 1.5 cP. The viscosity of the ink composition may be greater than or equal to about 0.1 cP, greater than or equal to about 0.5 cP, or greater than or equal to about 0.8 cP.

In an embodiment, an electronic device includes the aforementioned quantum dots. The device may include a display device, a light emitting diode (LED), an organic light emitting diode (OLED), a quantum dot LED, a sensor, a solar cell, an image sensor, or a liquid crystal display (LCD), but is not limited thereto. In an embodiment, the electronic device may include a photoluminescent device (e.g., a quantum dot sheet or a lighting such as a quantum dot rail or a liquid crystal display (LCD)). In a non-limiting embodiment, the electronic device may include a quantum dot sheet and the aforementioned quantum dots are dispersed in the sheet (e.g., in the form of a quantum dot polymer composite).

Hereinafter, the embodiments are illustrated in more detail with reference to examples. However, these examples are exemplary, and the present scope is not limited thereto.

EXAMPLES

Analysis Method
1. Photoluminescence Analysis
Photoluminescence (PL) spectra of the prepared quantum dots are obtained using a Hitachi F-7000 spectrometer at an irradiation wavelength of 372 nanometers (nm).
2. Ultraviolet-Visible (UV-Vis) Spectroscopic Analysis
Hitachi U-3310 spectrometer is used to perform a UV spectroscopic analysis and obtain UV-Visible absorption spectra.
3. Transmission Electron Microscopy (TEM) Analysis
Transmission electron microscopy photographs of quantum dots are obtained using an UT F30 Tecnai electron microscope.
4. ICP Analysis
An inductively coupled plasma-atomic emission spectroscopy (ICP-AES) analysis is performed using Shimadzu ICPS-8100.
5. Electroluminescence Spectroscopic Analysis
A current depending on a voltage is measured using a Keithley 2635B source meter while applying a voltage and electroluminescent (EL) light emitting luminance is measured using a CS2000 spectrometer.

Synthesis is performed under an inert gas atmosphere (nitrogen flowing condition) unless particularly mentioned.
Synthesis of Quantum Dots Example 1: (QD3)

(1) Selenium and tellurium are dispersed in trioctylphosphine (TOP) to obtain a Se/TOP stock solution and a Te/TOP stock solution, respectively.

4.5 millimoles (mmol) of zinc acetate along with oleic acid is dissolved in trioctylamine in a 250 milliliter (mL) reaction flask and then, heated at 120° C. under vacuum. After 1 hour, the atmosphere in the reactor is converted to an inert gas.

After heating the solution at 300° C., the Se/TOP stock solution and the Te/TOP stock solution produced above are rapidly injected thereinto at a ratio of Te:Se=1:30. The amount of Se with respect to one mole of Zn is 0.5 moles. After the completion of the reaction, the obtained reaction solution is cooled down to room temperature, ethanol is added thereto, the obtained mixture is centrifuged to obtain a precipitate, and the precipitate is dispersed in toluene to obtain a toluene dispersion of ZnSeTe core. An average size of the core is about 3 nm.

(2) Trioctylamine (TOA) is put in a 250 mL reaction flask, zinc acetate and oleic acid are added thereto, and the obtained mixture is treated under vacuum at 120° C. The atmosphere inside of the flask is replaced with nitrogen ($N_2$). The flask is heated up to 330° C. or 340° C. and the toluene dispersion of the ZnSeTe core is rapidly added thereto. A predetermined amount of the Se/TOP stock solution is intermittently added thereto three times while the reaction proceeds for 90 minutes to form a ZnSe layer on the core. Then, to the reaction flask, a predetermined amount of zinc acetate and a predetermined amount of a S/TOP stock solution are intermittently added thereto three times, respectively while another reaction proceeds for 30 minutes to form a ZnS layer. Herein, the used amounts of a Zn precursor, a Se precursor, and a S precursor are 3.0 mmol, 0.8 mmol, and 2.8 mmol, respectively.

(3) Characterization

Photoluminescence characteristics of a quantum dot produced therefrom are analyzed, and the results are shown in Table 1.

An inductively coupled plasma atomic emission spectroscopic (ICP-AES) analysis of the produced quantum dot is made, and the results are shown in Table 2.

Figure 5:
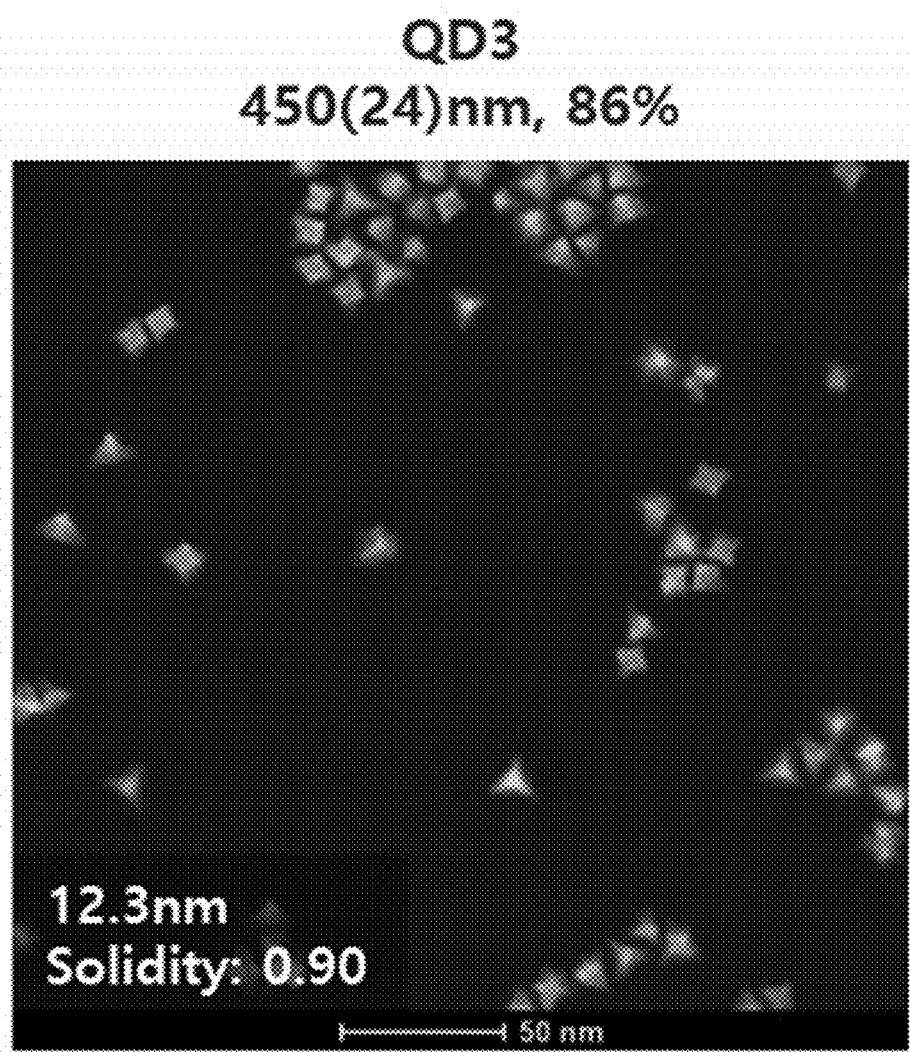
FIG. 5 is a transmission electron microscopic image of the quantum dots prepared in Example 1.

A transmission electron microscope analysis is made for the quantum dots thus prepared and the results are shown in FIG. 5. The results of FIG. 5 confirm that the prepared quantum dots have an average size of about 12.3 nm and a solidity of about 0.90:1. An average thickness of the shell is estimated to be about 4.65 (9.3/2) nm.

Example 2: QD4

(1) Core-shell quantum dots (QD4) are prepared in the same manner as set forth in Example 1 except that the used amounts of the zinc precursor, the Se precursor, and the S precursor are 3.6 mmol, 1.2 mmol, and 2.8 mmol, respectively.

(2) Characterization

Photoluminescence characteristics of a quantum dot produced therefrom are analyzed, and the results are shown in Table 1.

An inductively coupled plasma atomic emission spectroscopic (ICP-AES) analysis of the produced quantum dot is made, and the results are shown in Table 2.

Figure 6:
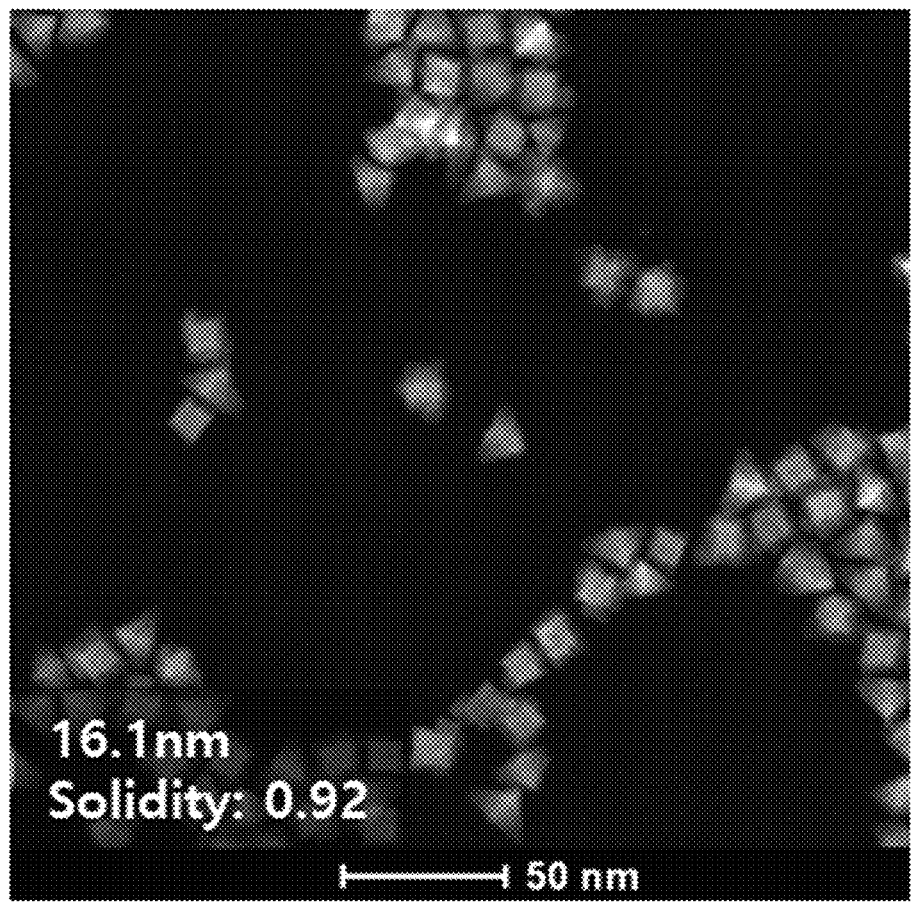
FIG. 6 is a transmission electron microscopic image of the quantum dots prepared in Example 2.

A transmission electron microscope analysis is made for the quantum dots thus prepared and the results are shown in FIG. 6. The results of FIG. 6 confirm that the prepared quantum dots have an average size of about 16.1 nm and a solidity of about 0.92:1. An average thickness of the shell is estimated to be about 6.55 nm (13.1/2) nm.

Example 3: QD5

(1) Core-shell quantum dots (QD5) are prepared in the same manner as set forth in Example 1 except that the used amounts of the zinc precursor, the Se precursor, and the S precursor are 4.5 mmol, 1.2 mmol, and 2.8 mmol, respectively.

(2) Characterization

Photoluminescence characteristics of a quantum dot produced therefrom are analyzed, and the results are shown in Table 1.

An inductively coupled plasma atomic emission spectroscopic (ICP-AES) analysis of the produced quantum dot is made, and the results are shown in Table 2.

Figure 7:
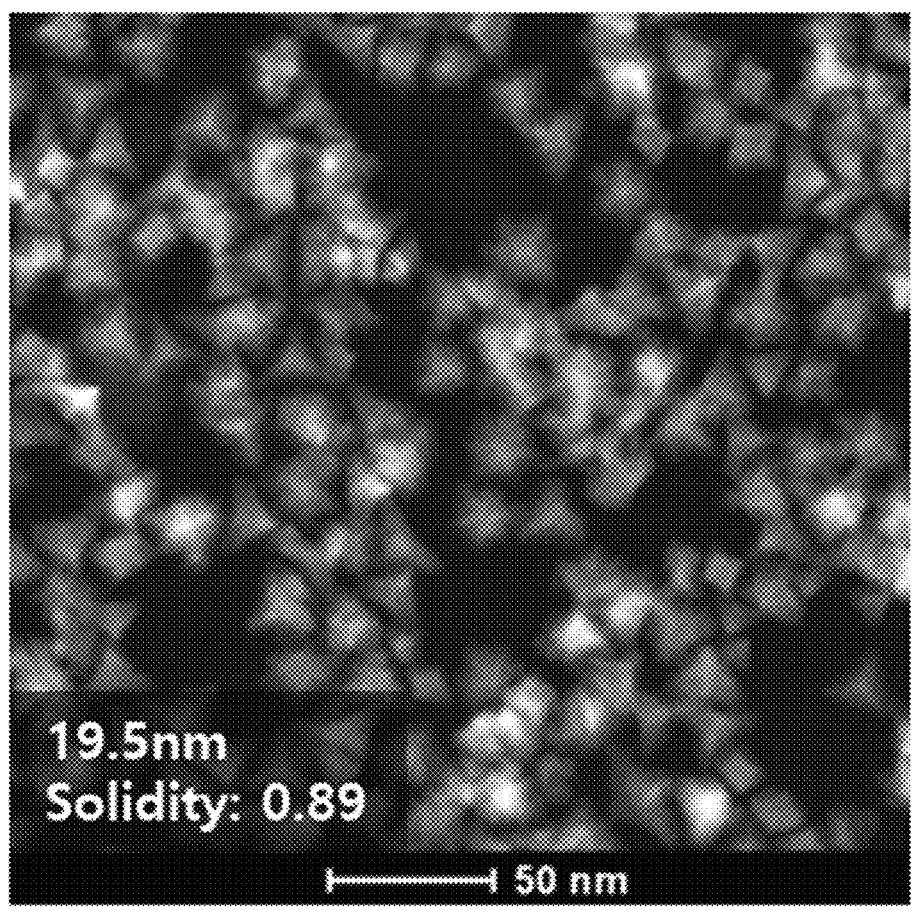
FIG. 7 is a transmission electron microscopic image of the quantum dots prepared in Example 3.

A transmission electron microscope analysis is made for the quantum dots thus prepared and the results are shown in FIG. 7. The results of FIG. 7 confirm that the prepared quantum dots have an average size of about 19.5 nm and a solidity of about 0.89:1. An average thickness of the shell is estimated to be about 8.25 (16.5/2) nm.

Comparative Example 1: QD1

(1) Core-shell quantum dots (QD1) are prepared in the same manner as set forth in Example 1 except that the used amounts of the zinc precursor, the Se precursor, and the S precursor are 3.0 mmol, 0.8 mmol, and 2.8 mmol, respectively, the reaction temperature is 320° C., and the Se precursor and the S precursor are added in a single step, respectively.

(2) Characterization

Photoluminescence characteristics of a quantum dot produced therefrom are analyzed, and the results are shown in Table 1.

An inductively coupled plasma atomic emission spectroscopic (ICP-AES) analysis of the produced quantum dot is made, and the results are shown in Table 2.

Figure 8:
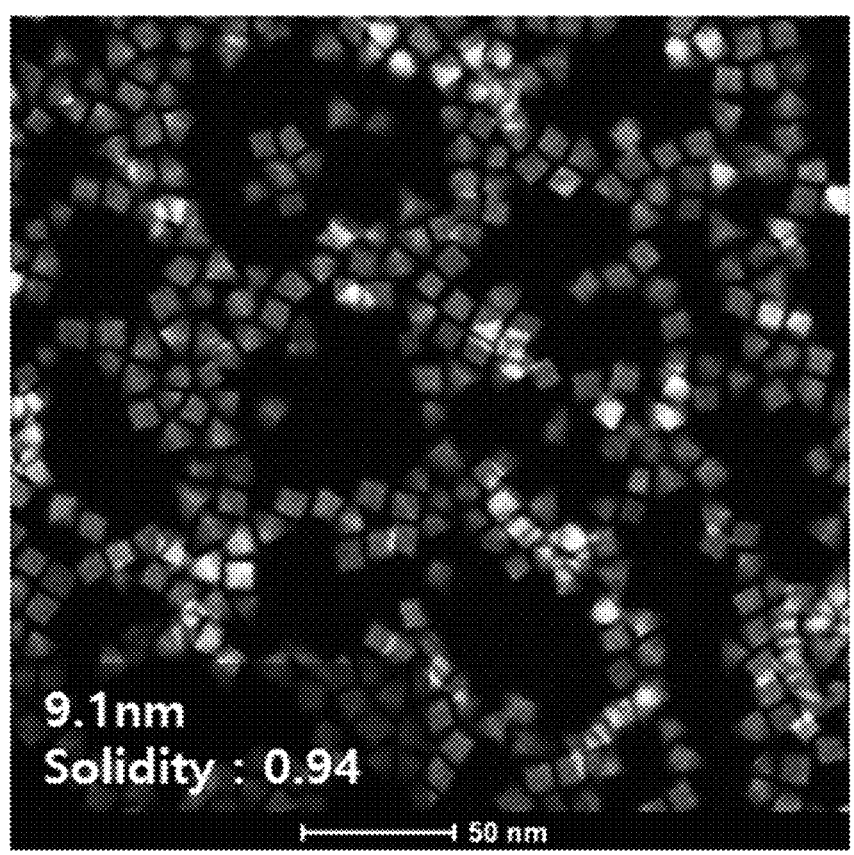
FIG. 8 is a transmission electron microscopic image of the quantum dots prepared in Comparative Example 1.

A transmission electron microscope analysis is made for the quantum dots thus prepared and the results are shown in FIG. 8. The results of FIG. 8 confirm that the prepared quantum dots have an average size of about 9.1 nm and a solidity of about 0.94:1. An average thickness of the shell is estimated to be about 3.05 (6.1/2) nm.

Comparative Example 2: QD2

(1) Core-shell quantum dots (QD2) are prepared in the same manner as set forth in Example 1 except that the used amounts of the zinc precursor, the Se precursor, and the S precursor are 2 mmol, 0.5 mmol, and 1.4 mmol, respectively, the reaction temperature is 320° C., and the Se precursor and the S precursor are added in a single step, respectively.

(2) Characterization

Photoluminescence characteristics of a quantum dot produced therefrom are analyzed, and the results are shown in Table 1.

An inductively coupled plasma atomic emission spectroscopic (ICP-AES) analysis of the produced quantum dot is made, and the results are shown in Table 2.

Figure 9:
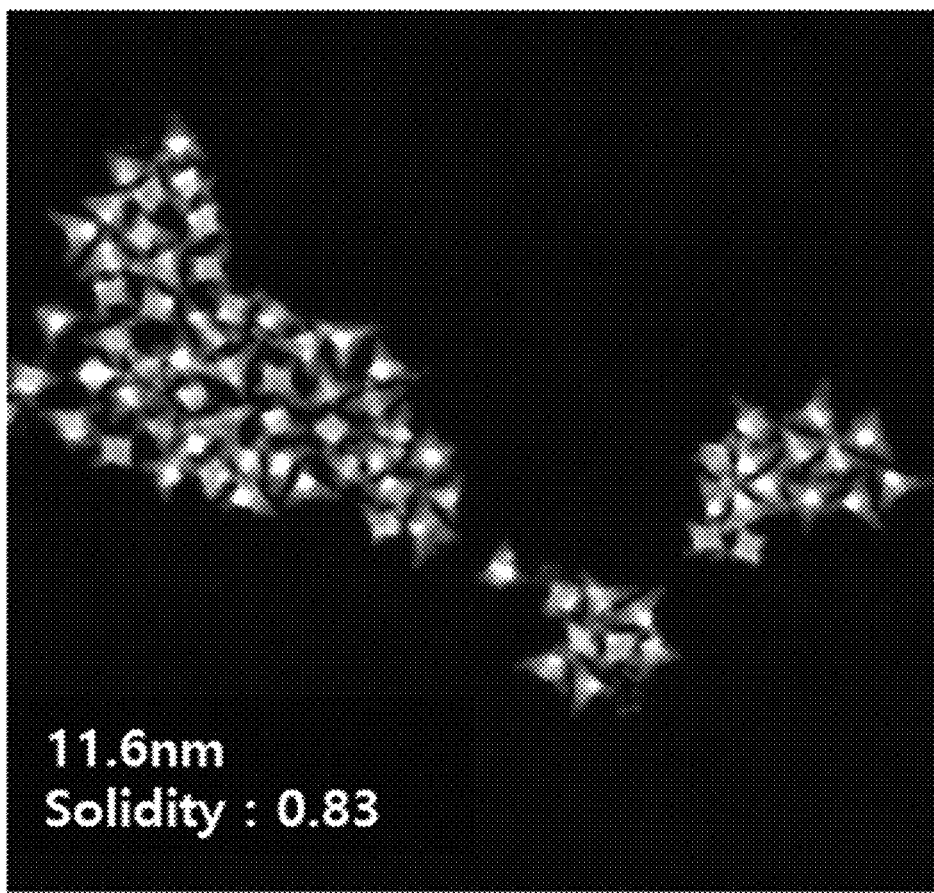
FIG. 9 is a transmission electron microscopic image of the quantum dots prepared in Comparative Example 2.

A transmission electron microscope analysis is made for the quantum dots thus prepared and the results are shown in FIG. 9. The results of FIG. 9 confirm that the prepared quantum dots have an average size of about 11.6 nm and a solidity of about 0.83:1. An average thickness of the shell is estimated to be about 4.3 (8.6/2) nm.

TABLE 1

|  | PL quantum yield (QY) (%) | Full width at half maximum (FWHM) (nm) | Solidity | Average Particle size (nm) |
|---|---|---|---|---|
| Comp. Example 1 (QD1) | 82 | 18 | 0.94 | 9.1 |
| Comp. Example 2 (QD2) | 85 | 22 | 0.83 | 11.6 |

TABLE 1-continued

|  | PL quantum yield (QY) (%) | Full width at half maximum (FWHM) (nm) | Solidity | Average Particle size (nm) |
|---|---|---|---|---|
| Example 1 (QD3) | 86 | 24 | 0.90 | 12.3 |
| Example 2 (QD4) | 72 | 24 | 0.92 | 16.1 |
| Example 3 (QD5) | 63 | 22 | 0.89 | 19.5 |

TABLE 2

| | ICP-AES Results | | | | |
|---|---|---|---|---|---|
| | S:Zn | Zn:Zn | Se:Zn | Te:Zn | (Se + S):Zn |
| Comp. Example 1 (QD1) | 0.22:1 | 1.00:1 | 0.65:1 | 0.002:1 | 0.87:1 |
| Comp. Example 2 (QD2) | 0.48:1 | 1.00:1 | 0.43:1 | — | 0.91:1 |
| Example 1 (QD3) | 0.52:1 | 1.00:1 | 0.38:1 | 0.002:1 | 0.90:1 |
| Example 2 (QD4) | 0.40:1 | 1.00:1 | 0.51:1 | 0.002:1 | 0.91:1 |
| Example 3 (QD5) | 0.53:1 | 1.00:1 | 0.34:1 | 0.002:1 | 0.87:1 |

The results of Tables 1 and 2 confirm that the quantum dots of the Examples have compositions, sizes, and shapes different from those of the quantum dots prepared in Comparative Examples.

Production of Electroluminescent Device

Example 4

An electroluminescent device is manufactured by using the quantum dot (QD3) of Example 1:

A poly(3,4-ethylenedioxythiophene):poly(styrene sulfonate) (PEDOT:PSS) layer and a poly(9,9-dioctyl-fluorene-co-N-(4-butylphenyl)-diphenylamine) (TFB) layer are spin-coated to respectively form a hole injection layer HIL and a hole transport layer (HTL) on a glass substrate deposited with an indium tin oxide (ITO) electrode (an anode).

On the TFB layer, a quantum dot emission layer is formed by spin-coating an octane dispersion of the quantum dot. On the quantum dot emission layer, a film based on crystalline zinc oxide nanoparticles (thickness: about 40 nm) is formed as the electron auxiliary layer, and then, an Al electrode is deposited thereon.

Figure 10:
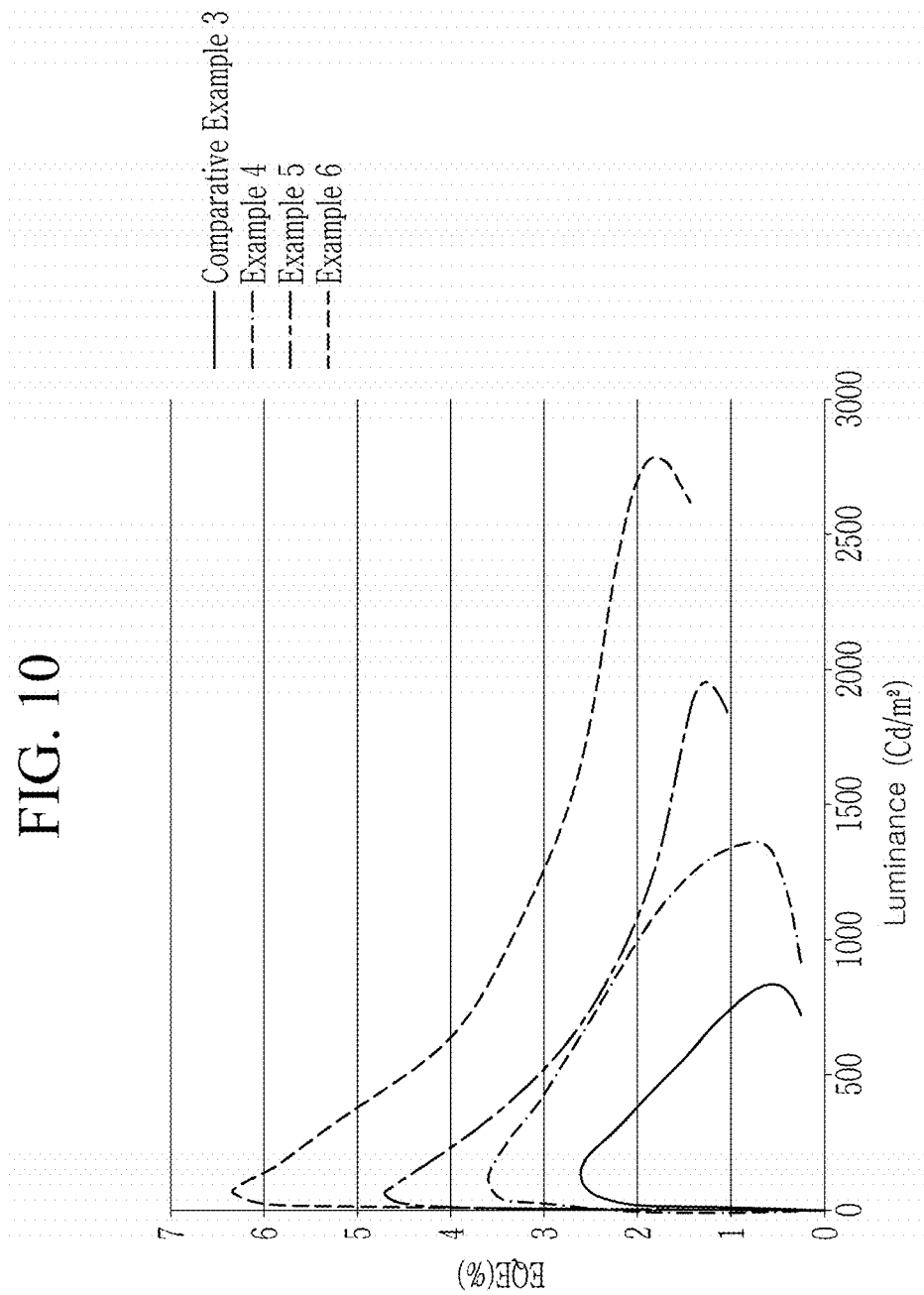
FIG. 10 is a graph of external quantum efficiency (EQE) (percent (%)) versus luminance (L) (candelas per square meter ($Cd/m^2$)) showing electroluminescent properties of the devices according to Examples 4 to 6 and Comparative Example 3.

Electroluminescent properties of the device are measured and the results are shown in FIG. 10 and Table 3.

Example 5

An electroluminescent device is manufactured in the same manner as set forth in Example 4, except for using the quantum dot (QD4) of Example 2.

Electroluminescent properties of the device are measured and the results are shown in FIG. 10 and Table 3.

Example 6

An electroluminescent device is manufactured in the same manner as set forth in Example 4, except for using the quantum dot (QD5) of Example 3.

Electroluminescent properties of the device are measured and the results are shown in FIG. 10 and Table 3.

Comparative Example 3

An electroluminescent device is manufactured in the same manner as set forth in Example 4, except for using the quantum dot (QD1) of Comp. Example 1.

Electroluminescent properties of the device are measured and the results are shown in FIG. 10 and Table 3.

Comparative Example 4

An electroluminescent device is manufactured in the same manner as set forth in Example 4, except for using the quantum dot (QD2) of Comp. Example 2.

Electroluminescent properties of the device are measured and the results are summarized in Table 3.

TABLE 3

| | Maximum External Quantum Efficiency (EQE) (%) | EQE @ 100 nits (candelas per square meter) (%) | Maximum luminance (Cd/m$^2$) | Maximum Photo-luminescence Wavelength (Lambda maximum) |
|---|---|---|---|---|
| Comp. Ex 3 (QD1) | 2.6 | 2.5 | 830 | 453 |
| Comp. Ex 4 (QD2) | 2.4 | 1.9 | 520 | 453 |
| Example 4 (QD3) | 3.6 | 3.6 | 1360 | 452 |
| Example 5 (QD4) | 4.7 | 4.5 | 1950 | 452 |
| Example 6 (QD5) | 6.3 | 6.1 | 2780 | 452 |

The results of FIG. 10 and Table 3 confirm that the electroluminescent device including the quantum dots of the Examples may exhibit improved electroluminescent properties in comparison with those of the device including the quantum dots of Comparative Examples.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device, comprising
a first electrode and a second electrode facing each other,
an emission layer disposed between the first electrode and the second electrode, the emission layer comprising quantum dots, and
wherein the quantum dots comprise
a first semiconductor nanocrystal comprising a zinc chalcogenide, and
a second semiconductor nanocrystal comprising zinc, sulfur, and selenium,
wherein the quantum dots do not comprise cadmium,
wherein the quantum dots are configured to emit blue light having a maximum photoluminescent peak wavelength in a range of greater than or equal to about 440 nanometers and a quantum yield of the quantum dots is greater than or equal to 60%,
wherein the quantum dots have an average value of solidity of greater than or equal to about 0.85, and
wherein the zinc chalcogenide comprises zinc, selenium, and tellurium.

2. The electroluminescent device of claim 1, wherein the quantum dots have an average particle size of greater than about 12 nanometers.

3. The electroluminescent device of claim 1, wherein the quantum dots have a core-shell structure having a core and a shell disposed on the core, and
wherein the core comprises the first semiconductor nanocrystal and the shell comprises the second semiconductor nanocrystal do not comprise manganese, copper, or a combination thereof.

4. The electroluminescent device of claim 1, wherein the quantum dots have a mole ratio of tellurium with respect to selenium of greater than or equal to about 0.001:1 and less than or equal to about 0.05:1.

5. The electroluminescent device of claim 1, wherein the quantum dots have a core-shell structure having a core and a shell disposed on the core, and
wherein the core comprises the first semiconductor nanocrystal and the shell comprises the second semiconductor nanocrystal.

6. The electroluminescent device of claim 5, wherein the shell comprises a concentration gradient in a radial direction, and optionally wherein an amount of the sulfur increases toward a surface of the quantum dots.

7. The electroluminescent device of claim 5, wherein the shell comprises
a first layer disposed on the core, and
an outer layer disposed on the first layer, and
wherein the first layer comprises a fourth semiconductor nanocrystal comprising zinc and selenium and
wherein the outer layer comprises a third semiconductor nanocrystal comprising zinc and sulfur.

8. The electroluminescent device of claim 7, wherein the first semiconductor nanocrystal comprises $ZnSe_{1-x}Te_x$, wherein, x is greater than 0 and less than or equal to about 0.05,
the fourth semiconductor nanocrystal comprises a ZnSe, and
the third semiconductor nanocrystal comprises a ZnS and does not comprises selenium.

9. The electroluminescent device of claim 7, wherein an energy bandgap of the first semiconductor nanocrystal is less than an energy bandgap of the fourth semiconductor nanocrystal and the energy bandgap of the fourth semiconductor nanocrystal is less than an energy bandgap of the third semiconductor nanocrystal, or
wherein an energy bandgap of the fourth semiconductor nanocrystal is less than an energy bandgap of the first semiconductor nanocrystal and an energy bandgap of the third semiconductor nanocrystal.

10. The electroluminescent device of claim 5, wherein a thickness of the shell is greater than or equal to about 4 nm.

11. The electroluminescent device of claim 1, wherein in the quantum dots, a mole ratio of sulfur with respect to selenium is greater than or equal to about 0.7 and less than or equal to about 1.6.

12. The electroluminescent device of claim 1, wherein the quantum dots have an average value of solidity of greater than or equal to about 0.89.

13. The electroluminescent device of claim 1, wherein the electroluminescent device comprises a charge auxiliary layer between the first electrode and the quantum dot emission layer, between the second electrode and the quantum dot emission layer, or between the first electrode and the quantum dot emission layer and between the second electrode and the quantum dot emission layer.

14. Quantum dots comprising
a first semiconductor nanocrystal comprising a zinc chalcogenide; and
a second semiconductor nanocrystal comprising zinc, sulfur, and selenium,
wherein the quantum dots are configured to emit blue light having a maximum photoluminescent peak wavelength in a range of greater than or equal to about 440 nanometers and a quantum yield of the quantum dots is greater than or equal to 60%,
wherein the quantum dots have an average value of solidity of greater than or equal to about 0.85, and
wherein the zinc chalcogenide comprises zinc, selenium, and tellurium.

15. The quantum dots of claim 14, wherein the quantum dots have a core-shell structure having a core and a shell disposed on the core, and
wherein the core comprises the first semiconductor nanocrystal and the shell comprises the second semiconductor nanocrystal.

16. The quantum dots of claim 15, wherein a thickness of the shell is greater than or equal to about 4 nm.

17. The quantum dots of claim 15, wherein the semiconductor nanocrystal shell comprises
a first layer disposed on the core and
an outer layer disposed on the first layer, and
wherein the first layer comprises a fourth semiconductor nanocrystal comprising zinc and selenium and
wherein the outer layer comprises a third semiconductor nanocrystal comprising zinc and sulfur.

18. The quantum dots of claim 17, wherein an energy bandgap of the first semiconductor nanocrystal is less than an energy bandgap of the fourth semiconductor nanocrystal and the energy bandgap of the fourth semiconductor nanocrystal is less than an energy bandgap of the third semiconductor nanocrystal, or
wherein an energy bandgap of the fourth semiconductor nanocrystal is less than an energy bandgap of the first semiconductor nanocrystal and an energy bandgap of the third semiconductor nanocrystal.

19. The quantum dots of claim 14, wherein the quantum dots have an average particle size of greater than or equal to about 12 nanometers, and wherein the quantum dots have an average value of solidity of greater than or equal to about 0.89.

20. A composition comprising
the quantum dots of claim 14 and
an organic solvent.

21. A method of producing quantum dots of claim 14, which comprises:
obtaining a first semiconductor nanocrystal including zinc, selenium, and tellurium; reacting a zinc precursor in an organic solvent in the presence of the first semiconductor nanocrystal and the organic ligand with a non-metal precursor of a selenium precursor, a sulfur precursor, or a combination thereof, a plurality of times, to form the second semiconductor nanocrystal, at a temperature of greater than 320° C., and
wherein the non-metal precursors are intermittently injected at a predetermined amount divided from a desired total amount at least two times.

* * * * *